United States Patent
Moon et al.

(10) Patent No.: US 8,901,415 B2
(45) Date of Patent: Dec. 2, 2014

(54) CONDUCTING POLYMER TO WHICH PYRENE COMPOUNDS ARE INTRODUCED, AND ORGANIC SOLAR CELL USING SAME

(75) Inventors: Sang Jin Moon, Daejeon (KR); Jong Cheol Lee, Daejeon (KR); Won Wook So, Daejeon (KR); Won Suk Shin, Seoul (KR); Sang Kyu Lee, Daejeon (KR); Sung Cheol Yoon, Yongin-si (KR); Dohoon Hwang, Daegu (KR); Chang Jin Lee, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 253 days.

(21) Appl. No.: 13/513,761

(22) PCT Filed: Oct. 13, 2010

(86) PCT No.: PCT/KR2010/007003
§ 371 (c)(1),
(2), (4) Date: Aug. 16, 2012

(87) PCT Pub. No.: WO2011/068305
PCT Pub. Date: Jun. 9, 2011

(65) Prior Publication Data
US 2012/0305082 A1    Dec. 6, 2012

(30) Foreign Application Priority Data

Dec. 3, 2009  (KR) .......................... 10-2009-0118973
Dec. 3, 2009  (KR) .......................... 10-2009-0118975

(51) Int. Cl.
| | |
|---|---|
| *H01L 31/00* | (2006.01) |
| *C08G 61/12* | (2006.01) |
| *H01L 51/00* | (2006.01) |
| *C08L 65/00* | (2006.01) |
| *H01L 51/42* | (2006.01) |

(52) U.S. Cl.
CPC .... *H01L 51/0043* (2013.01); *C08G 2261/3246* (2013.01); *C08G 2261/314* (2013.01); *C08G 61/126* (2013.01); *H01L 51/0094* (2013.01); *C08G 2261/3223* (2013.01); *H01L 51/0036* (2013.01); *C08G 2261/3142* (2013.01); *H01L 51/0054* (2013.01); *C08G 2261/344* (2013.01); *H01L 51/42* (2013.01); *C08G 2261/411* (2013.01); *Y02E 10/549* (2013.01); *C08L 65/00* (2013.01)
USPC ........................................................ 136/263

(58) Field of Classification Search
None
See application file for complete search history.

(56) References Cited

U.S. PATENT DOCUMENTS

2006/0154107 A1    7/2006    Kubota et al.

FOREIGN PATENT DOCUMENTS

| | | |
|---|---|---|
| JP | 2007-015961 | 1/2007 |
| KR | 10-0786947 | 12/2007 |
| KR | 10-2009-0107316 | 10/2009 |

OTHER PUBLICATIONS

Hou, et al.; "Synthesis, Characterization, and Photovoltaic Properties of a Low Band Gap Polymer Based on Silole-Containing Polythiophenes and 2,1,3-Benzothiadiazole;" *J. Am. Chem. Soc.*; vol. 130 (48), pp. 16144-161455.
Kim, et al.; "Efficient Tandem Polymer Solar Cells Fabricated by All-Solution Processing;" *Science*; 2007; vol. 317, pp. 222-225.

*Primary Examiner* — Eli Mekhlin
(74) *Attorney, Agent, or Firm* — D. Peter Hochberg; Sean F. Mellino; Richard A. Wolf

(57) ABSTRACT

The present invention relates to a pyrene-containing conductive polymer represented by formula 1 and an organic solar cell comprising the same as an organic photovoltaic material. The conductive polymer has improved hole mobility as a result of introducing a specific amount of pyrene either into a polymer, which consists only of a donor functional group comprising one or more aromatic monomers, or into a donor-acceptor type polymer comprising a repeating acceptor introduced into a donor functional group. Thus, the conductive polymer can be used as an organic photovoltaic material in organic photodiodes (OPDs), organic light-emitting diodes (OLEDs), organic thin-film transistors (OTFTs), organic solar cells and the like. In addition, an organic solar cell showing high power conversion efficiency (PCE) can be provided using an organic photovoltaic material comprising the pyrene-containing conductive polymer as an electron donor.

11 Claims, 2 Drawing Sheets

CONDUCTING POLYMER TO WHICH PYRENE COMPOUNDS ARE INTRODUCED, AND ORGANIC SOLAR CELL USING SAME

CROSS-REFERENCE TO RELATED APPLICATIONS

This application is a National Stage application of International Application No. PCT/KR2010/007003, filed on Oct. 13, 2010, which claims priority of Korean application Serial Number 10-2009-0118973 filed on Dec. 3, 2009 and Korean application Serial Number 10-2009-0118975 filed on Dec. 3, 2009, all of which are incorporated herein by reference in their entireties.

BACKGROUND OF THE INVENTION

1. Field of the Invention

The present invention relates to a pyrene-containing conductive polymer represented by formula 1 and an organic solar cell comprising the same as an organic photovoltaic material. More particularly, the present invention relates to a conductive polymer having improved hole mobility, prepared by introducing pyrene either into a polymer, which consists only of a donor functional group comprising one or more aromatic monomers, or into a donor-acceptor type polymer comprising a repeating acceptor introduced into a donor functional group, and to an organic solar cell comprising the conductive polymer as an organic photovoltaic material.

2. Description of the Prior Art

Organic thin-film solar cells use organic materials as a photoactive layer and have advantages in that they have a thin thickness of several hundred nm or less, use relatively inexpensive materials as the photoactive layer and can be fabricated as flexible devices. Due to such advantages, many studies on the organic thin-film solar cells have been conducted.

The photoactive layer is generally made of two materials having different electron affinities, in which one of the photoactive materials is excited by absorption of light to form excitons, and electrons in the lower electron affinity material (donor) move to the higher electron affinity material (acceptor) across the interface between the two materials so that the excitons are separated into holes and electrons. Herein, the distance by which the excitons can move is about 10 nm, even though it varies depending on materials. Thus, if the distance between the position of light absorption and the interface of the two materials having different electron affinities is about 10 nm or less, the separation of excitons into electrons and holes can be achieved with the highest efficiency. For this reason, a bulk heterojunction structure comprising a mixture of donor and acceptor materials is mainly used.

Methods for fabricating organic solar cells are broadly divided into two methods: a method of fabricating a thin film by thermally depositing donor and acceptor materials, and a method of fabricating a thin film using a solution process.

Specifically, in the method employing thermal deposition, both the donor and acceptor materials are monomers, whereas in the method employing the solution process, the donor material is generally a polymer, and the acceptor material is a polymer, a fullerene derivative, a perylene derivative, inorganic quantum dot nanoparticles, or the like. Thus, when the solution process employing polymers is used, large-area devices can be fabricated in an inexpensive manner compared to when monomers are thermally deposited. For this reason, in recent years, studies on the solution process employing polymers have been actively conducted.

Till now, the use of a fullerene derivative as the acceptor material has showed the highest efficiency [J. Am. Chem. Soc., 2008, 130(48), 16144]. In order to increase photoelectric conversion efficiency, tandem-type devices comprising an intermediate electrode sandwiched between two polymers that absorb light in different regions have also been developed [Science, 2007, 317, 222].

Organic solar cells should satisfy high photoelectric conversion efficiency. To achieve high photoelectric conversion efficiency, the following requirements should be satisfied. First, a large amount of photons should be absorbed in the light absorption layer. Second, the absorbed and excited excitons should move to the donor/acceptor interface so that they should be effectively separated into holes and electrons. Third, the separated holes and electrons should move to the positive and negative electrodes without loss.

When a fullerene derivative is used as an acceptor material in the bulk heterojunction structure, the separation of excitons appears to occur quantitatively. Thus, in order to achieve high photoelectric conversion efficiency in organic thin-film solar cells, a polymer that is used as the donor material should satisfy both the property of absorbing a large amount of photons and the ability to move holes.

Accordingly, the present inventors have extensive efforts to develop a novel polymer which can be used in organic solar cells in order to increase power conversion efficiency, and as a result, have devised a novel molecular design having improved hole mobility by introducing pyrene either into a polymer, which consists only of a donor functional group comprising one or more aromatic monomers, or into a donor-acceptor type polymer comprising a repeating acceptor introduced into a donor functional group, thereby completing the present invention.

SUMMARY OF THE PRESENT INVENTION

Technical Problem

It is an object of the present invention to provide a novel conductive polymer having improved hole mobility and the use thereof as an organic photoelectric material.

Another object of the present invention is to provide an organic solar cell showing improved power conversion efficiency, which comprises said conductive polymer as an organic photovoltaic material.

Technical Solution

In order to accomplish the above objects, the present invention provides a pyrene-containing conductive polymer represented by the following formula 1:

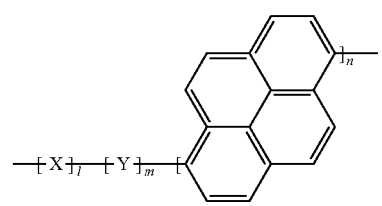

[Formula 1]

wherein l is the molar fraction of monomer X and is $$0.40 \leq \frac{l}{l+m+n} < 1,$$

m is the molar fraction of monomer Y and is $$0 \leq \frac{m}{l+m+n} \leq 0.50,$$

n is the molar fraction of pyrene and is $$0 < \frac{n}{l+m+n} \leq 0.10,$$

and each of X and Y is a monomer structure having a donor, acceptor or light absorption function.

The content of pyrene in the conductive polymer is preferably $$0 < \frac{n}{l+m+n} \leq 0.10,$$

and more preferably $$0 < \frac{n}{l+m+n} \leq 0.05.$$

Moreover, any one of X and Y is a donor monomer, and the other is an acceptor monomer.

The present invention also provides the use of a pyrene-containing conductive polymer, represented by formula 1, as an organic electronic material in any one selected from the group consisting of organic photodiodes (OPDs), organic light-emitting diodes (OLEDs), organic thin-film diodes (OTFTs) and organic solar cells.

Herein, the content of pyrene in the conductive polymer is preferably $$0 < \frac{n}{l+m+n} \leq 0.10,$$

and more preferably $$0 < \frac{n}{l+m+n} \leq 0.05.$$

The present invention also provides an organic solar cell comprising a substrate, a first electrode, a buffer layer, a photoelectric conversion layer and a second electrode, wherein the photoelectric conversion layer is made of a solution containing a photoelectric conversion material which is a mixture of the pyrene-containing conductive polymer of formula 1 as an electron donor and a $C_{60}$ or $C_{70}$ fullerene derivative as an electron acceptor. Herein, the content of pyrene in the conductive polymer is preferably $$0 < \frac{n}{l+m+n} \leq 0.10,$$

and more preferably $$0 < \frac{n}{l+m+n} \leq 0.05.$$

In the organic solar cell of the present invention, the photoelectric conversion layer is made of a mixture of the pyrene-containing conductive polymer of formula 1 as an electron donor and a $C_{60}$ or $C_{70}$ fullerene derivative as an electron acceptor, wherein the electron donor and the electron acceptor are mixed with each other at a weight ratio of 1:0.5-1:4.

In addition, the solution containing the photoelectric conversion material is a solution prepared by dissolving the photoelectric conversion material in any one solvent selected from the group consisting of chlorobenzene, 1,2-dichlorobenzene and chloroform at a concentration of 1.0-3.0 wt %. Herein, the solution containing the photoelectric conversion material may be applied or coated by a method selected from among inkjet printing, spin coating, screen printing, blade coating and slit coating.

Advantageous Effects

According to the present invention, there is provided a novel conductive polymer which improves power conversion efficiency in an organic solar cell. Specifically, the conductive polymer of the present invention has improved hole mobility as a result of introducing pyrene either into a polymer, which consists only of a donor functional group comprising one or more aromatic monomers, or into a donor-acceptor type polymer comprising a repeating acceptor introduced into a donor functional group, and is useful as a photoelectric conversion material.

Thus, according to the present invention, an organic solar cell showing high power conversion efficiency (PCE) can be provided using an organic photovoltaic material comprising the pyrene-containing conductive polymer as an electron donor.

DETAILED DESCRIPTION OF THE PREFERRED EMBODIMENT

Best Mode

Figure 1:
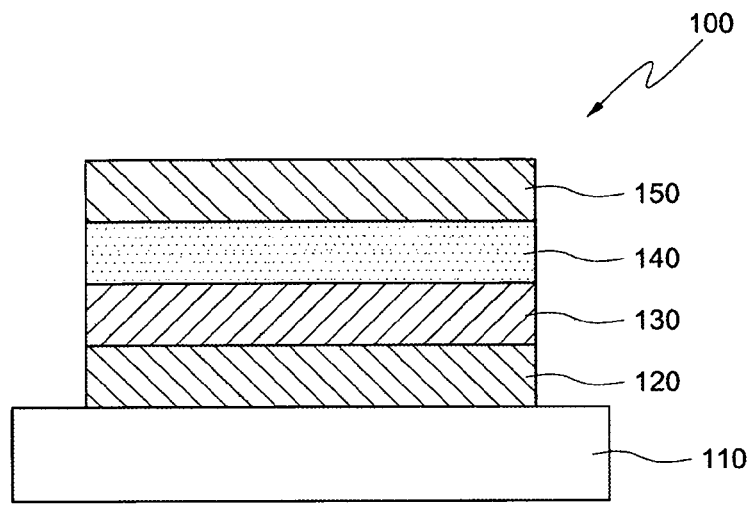
FIG. 1 is a schematic view of an organic photoelectric device fabricated according to the examples of the present invention.

Hereinafter, the present invention will be described in detail.

The present invention provides a pyrene-containing conductive polymer represented by the following formula 1:

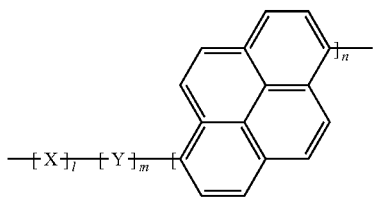

[Formula 1]

wherein l is the molar fraction of monomer X and is $$0.40 \leq \frac{l}{l+m+n} < 1,$$

m is the molar fraction of monomer Y and is $$0 \leq \frac{m}{l+m+n} \leq 0.50,$$

n is the molar fraction of pyrene and is $$0 < \frac{n}{l+m+n} \leq 0.10,$$

and each of X and Y is a monomer structure having a donor, acceptor or light absorption function.

The conductive polymer of formula 1 has high hole mobility as a result of introducing pyrene either into a polymer, which consists only of a donor functional group comprising one or more aromatic monomers, or into a donor-acceptor type polymer comprising a repeating acceptor introduced into a donor functional group, and is useful as a photoelectric conversion material.

The content of pyrene in the conductive polymer of formula 1 is preferably $$0 < \frac{n}{l+m+n} \leq 0.10,$$

and more preferably $$0 < \frac{n}{l+m+n} \leq 0.05.$$

In this case, the conductive polymer has improved hole mobility and shows high photon absorption efficiency. When the content of pyrene is more than 0.10, the conductive polymer will have low solubility so that it cannot be used as a photoelectric conversion material, and the power conversion efficiency thereof will decrease.

Moreover, in order to increase the absorbance of the conductive polymer of formula 1 and enable the polymer to self-assemble, X, Y or a combination of X and Y is important. Herein, when any one of X and Y is a donor monomer, the other could be an acceptor monomer.

The donor monomer used in the present invention is preferably any one selected from among compounds represented by the following formulas 2 to 10:

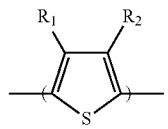

[Formula 2]

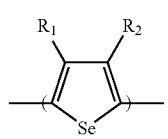

[Formula 3]

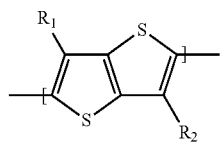

[Formula 4]

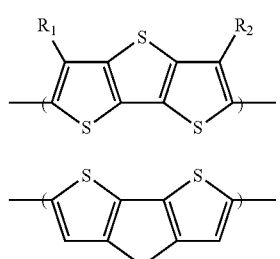

[Formula 5]

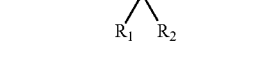

[Formula 6]

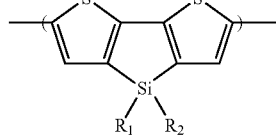

[Formula 7]

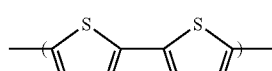

[Formula 8]

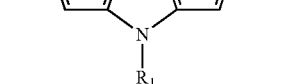

[Formula 9]

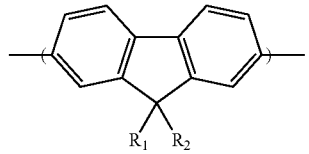

[Formula 10]

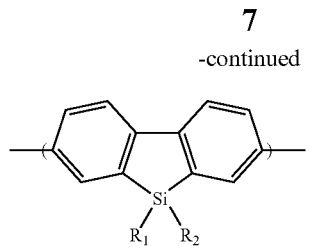

wherein $R_1$ or $R_2$ is a $C_1$-$C_{20}$ straight or branched alkyl group, a $C_1$-$C_{20}$ heterocycloalkyl, a $C_6$-$C_{20}$ aryl or a $C_6$-$C_{20}$ heteroaryl.

Furthermore, the acceptor monomer used in the present invention is preferably any one selected from among compounds represented by the following formulas 11 to 17:

[Formula 11]

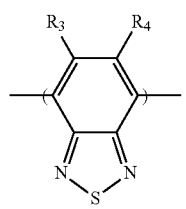

[Formula 12]

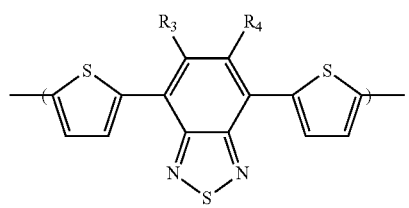

[Formula 13]

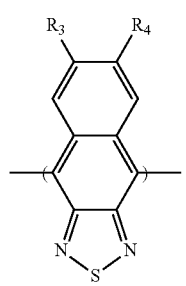

[Formula 14]

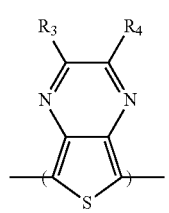

[Formula 15]

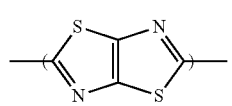

[Formula 16]

[Formula 17]

wherein $R_3$ or $R_4$ is a $C_1$-$C_{20}$ straight or branched alkyl group, a $C_1$-$C_{20}$ alkoxy group, a $C_6$-$C_{20}$ aryl group, a $C_1$-$C_{20}$ heterocycloalkyl, a $C_6$-$C_{20}$ aryl or a $C_6$-$C_{20}$ heteroaryl, and $R_3$ and $R_4$ may be the same or different.

In the inventive conductive polymer of formula 1, X and Y may be not only the above-described donor monomer or acceptor monomer, but also any known conductive functional group or any monomer functioning to absorb light. Preferably, both X and Y may be crystalline thiophene derivatives. More preferably, X may have a donor functional group, and Y may have an acceptor functional group, so that a donor-acceptor type low-bandgap polymer can be provided.

The present invention also provides the use of a pyrene-containing conductive polymer as an organic photoelectric material, represented by the following formula 1, as an electron donor:

[Formula 1]

wherein l, m and n are as defined above.

The content of pyrene in the conductive polymer of formula 1 is preferably $$0 < \frac{n}{l+m+n} \leq 0.10,$$

and more preferably $$0 < \frac{n}{l+m+n} \leq 0.05.$$

In a first preferred embodiment of the present invention, which corresponds to Examples 1 to 3 of the present invention, a conductive polymer containing pyrene in a copolymer of fluorene and dithienylbenzothiadizole is prepared according to the following reaction scheme 1:

[Reaction Scheme 1]
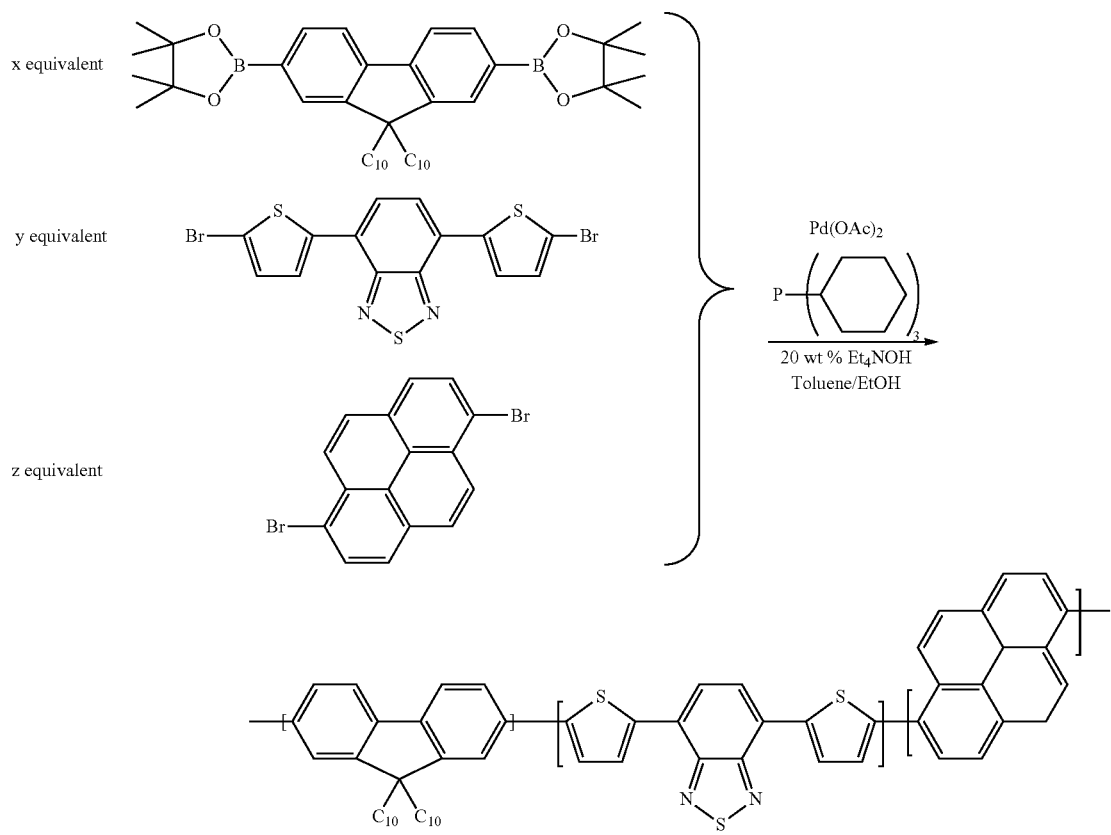
In a second preferred embodiment of the present invention, which corresponds to Examples 5 and 6 of the present invention, a conductive polymer containing pyrene in a copolymer of dithiophenesilole and benzothiazole is prepared according to the following reaction scheme 2:
[Reaction Scheme 2]
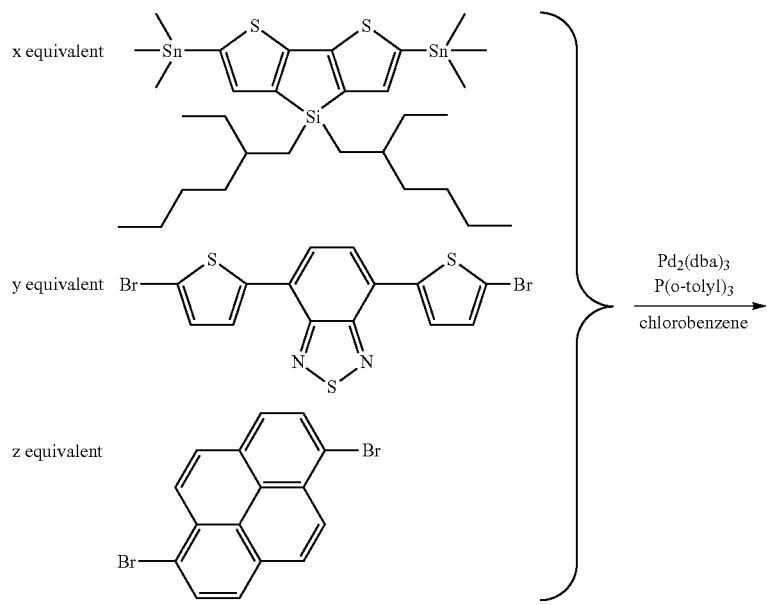

-continued

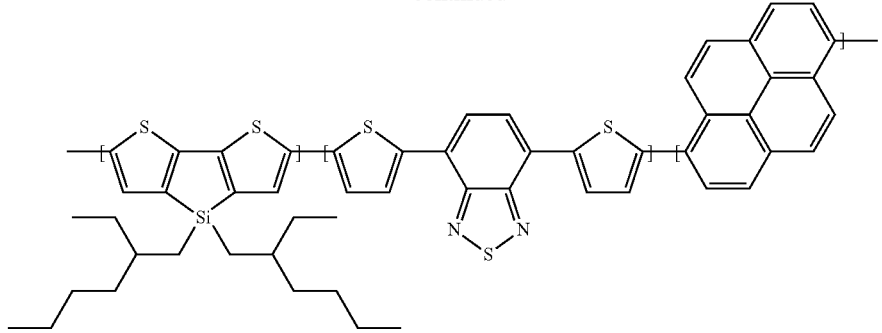

According to the present invention, a conductive polymer having improved hole mobility can be provided by introducing pyrene into the main chain of the conductive polymer in an amount of 10 mole % or less, preferably 5 mole % or less.

The conductive polymers according to the examples of the present invention are intended to more specifically the present invention, and from the description of the examples of the present invention, any person skilled in the art can understand that various conductive polymers falling within the scope of the present invention can be easily synthesized using combinations of the above-described donor and acceptor monomers.

When the pyrene-containing conductive polymer of the present invention is used as an electron donor in an organic solar cell and a fullerene derivative is used as an acceptor, the organic solar cell shows high power conversion efficiency (Tables 1 and 2), thereby satisfying both high photon absorption and high hole mobility.

Thus, the pyrene-containing conductive polymer of formula 1 according to the present invention is useful as an organic electronic material for a nonlinear optical material serving in organic photodiode (OPD), organic light-emitting diode (OLED), organic thin-film transistor (OFTF), organic solar cell and the like.

The present invention also provides an organic solar cell comprising a substrate, a first electrode, a buffer layer, a photoelectric conversion layer and a second electrode, wherein the photoelectric conversion layer is made of an organic photovoltaic material which is a mixture of the pyrene-containing conductive polymer of formula 1 as an electron donor and a $C_{60}$ or $C_{70}$ fullerene derivative as an electron acceptor.

As shown in FIG. 1, the organic solar cells of the present invention comprises a substrate a substrate 110, a first electrode 120, a buffer layer 130, a photoelectric layer 140 and a second electrode 150, which are deposited from bottom to top in this order, wherein the photoelectric conversion layer 140 is formed of a solution containing a mixture of the pyrene-containing conductive polymer of formula 1 as an electron donor and a $C_{60}$ fullerene or a $C_{70}$ fullerene as an electron acceptor. FIG. 1 is a schematic diagram showing an organic solar cell comprising an organic photovoltaic device fabricated according to a preferred embodiment of the present invention.

In addition, in the organic photovoltaic device of the present invention, an electron transfer layer, a hole blocking layer or an optical space layer may be introduced between the photoelectric conversion layer 140 and the second electrode 150.

Because the conductive polymer used as the electron donor in the organic photovoltaic device of the present invention contains pyrene, the organic photovoltaic device of the present invention may have high photon absorption efficiency and improved hole mobility, thereby achieving high power conversion efficiency in the organic solar cell (Tables 1 and 2).

The content of pyrene in the conductive polymer which is used as the electron donor in the organic photovoltaic device of the present invention is preferably $$0 < \frac{n}{l+m+n} \leq 0.10,$$

and more preferably $$0 < \frac{n}{l+m+n} \leq 0.05.$$

The material of the substrate 110 used in the organic photovoltaic device of the present invention is preferably a transparent material, and examples thereof include glass or plastic materials, such as PET (polyethylene terephthalate), PEN (polyethylene naphthelate), PP (polypropylene), PI (polyamide), TAC (triacetyl cellulose) and the like, with the preferred being glass.

The first electrode 120 may be formed by applying a transparent material or a film of transparent material on one surface of the substrate 110 by sputtering, spin coating or the like. The first electrode 120 functions as an anode. As the material of the first electrode 120, any material may be used without particular limitation, as long as it is a transparent conductive material having a work function lower than that of the second electrode 150 as described below. Examples of the material of the first electrode 120 include ITO (indium-tin oxide), FTO (fluorine doped tin oxide), ZnO—($Ga_2O_3$ or $Al_2O_3$), $SnO_2$—$Sb_2O_3$ and the like. More preferably, ITO is used.

The buffer layer 130 which is formed on the first electrode 120 may be made of poly(3,4-ethylenedioxythiophene) doped with polystyrene sulfonate [PEDOT:PSS], which can enhance hole mobility. The buffer layer 130 can be formed by a method such as spin coating.

Meanwhile, on the buffer layer 130, the photoelectric conversion layer 140 is deposited. The photoelectric conversion layer 140 has a junction structure of an electron donor and an electron acceptor and provides a photovoltaic effect by fast charge transfer between the electron donor and the electron acceptor.

In the present invention, the pyrene-containing conductive polymer of formula 1 serves as the electron donor in the photoelectric conversion layer 140, and a $C_{60}$ fullerene derivative or a $C_{70}$ fullerene derivative serves as the electron acceptor.

Also, in the photoelectric conversion material of the photoelectric conversion layer 140 of the present invention, the mixing ratio between the pyrene-containing conductive polymer of formula 1 and the $C_{60}$ fullerene derivative or the $C_{70}$ fullerene derivative is preferably a weight ratio of 1:0.5-1:4. If the fullerene derivative is used at a weight ratio of less than 0.5, the movement of produced electrons will be insufficient due to lack of the content of the crystallized fullerene derivative, and if the fullerene derivative is used a weight ratio of more than 4, the amount of the conductive polymer that absorbs light will be decreased, so that the efficient absorption of light will not be achieved.

The photoelectric conversion material which consists of the mixture of the pyrene-containing conductive polymer and the $C_{60}$ fullerene derivative or the $C_{70}$ fullerene derivative is dissolved in a single organic solvent or two or more organic solvents having different boiling points to prepare a solution. Specifically, the photoelectric conversion material is dissolved in any one solvent selected from chlorobenzene, 1,2-dichlorobenzene and chloroform no as to reach a solid content of 1.0-3.0 wt %. If the solid content of the solution is less than 1.0 wt %, there will be a problem in maintaining the thickness of the photoelectric conversion layer at 60 nm or more, and if the solid content is more than 3.0 wt %, a significant amount of the conductive polymer and the $C_{70}$ fullerene derivative will not be dissolved.

Then, the solution of the photoelectric conversion material is applied or coated by a method selected from among spin coating, screen printing, inkjet printing, blade coating, and slit coating, thereby forming the photoelectric conversion layer 140 having a thickness of about 60 nm or more, and preferably 65-200 nm.

The second electrode 150 can be formed on the photoelectric conversion layer 140 by thermally depositing a metal material such as aluminum under a vacuum of about $10^{-7}$ torr or less to a thickness of 100-200 nm.

Examples of a material that can be used to form the second electrode 150 include gold, aluminum, copper, silver, or their alloys, such as a calcium/aluminum alloy, a magnesium/silver alloy, aluminum/lithium alloy, and the like. Preferably, aluminum or an aluminum/calcium alloy is used.

Mode for Invention

Hereinafter, the present invention will be described in further detail with reference to examples. It is to be understood, however, that these examples are for illustrative purposes and the scope of the present invention is not limited thereto.

Example 1

Synthesis of Conductive Polymer-2

Polymer-2:

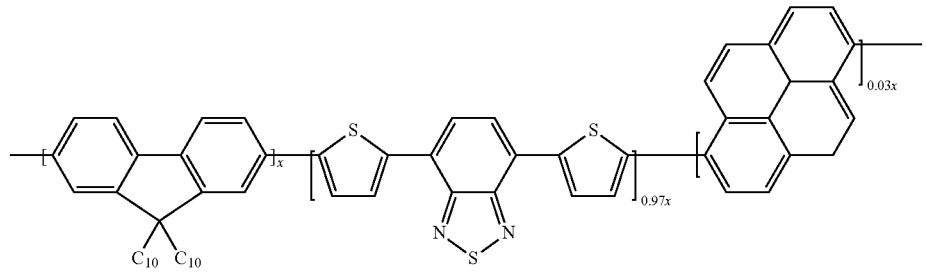

0.300 g (0.429 mmol) of 2,7-bis(4',4',5',5'-tetramethyl-1',3',2'-dioxaborolan-2'-yl)-9,9-didecylfluorene, 0.191 g (0.416 mmol) of 4,7-di-2'-(5'-bromo)-thienyl-2,1,3-benzothiadiazole, and 0.00464 g (0.0129 mmol) of 1,6-dibromopyrene were charged into a reaction flask and maintained in a vacuum for 1 hour, after which 7 ml of toluene was added thereto, and the mixture was stirred for 30 minutes. After 1.5 ml of ethanol and 1.5 ml of 20 wt % $Et_4NOH$ have been added thereto, the solution was bubbled with nitrogen to remove oxygen dissolved in the solvent. Then, 2.9 mg (0.0129 mmol) of $Pd(OAc)_2$ and 10.8 mg (0.0386 mmol) of tricyclohexylphosphine were added thereto, and the mixture was refluxed in a nitrogen atmosphere for 2 days while the temperature of the external oil bath was maintained at 120° C.

0.05 g of phenylboronic acid was added thereto and allowed to react for 3 hours, and then 0.12 g of bromobenzene was added and allowed to react for 4 hours. The reaction solution was dropped into 300 ml of methanol, and the resulting crude solid polymer was washed with methanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 200 mg of a polymer-2 [Mw=19,000 g/mol (PDI=2.4)].

Example 2

Synthesis of Conductive Polymer-3

Polymer 3:

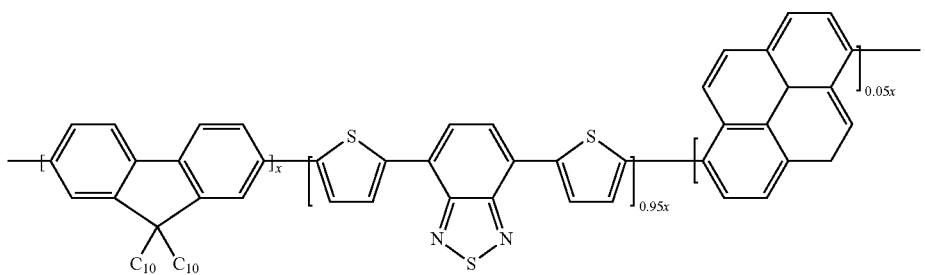

The procedure of Example 1 was repeated, except that 0.300 g (0.429 mmol) of 2,7-bis(4',4',5',5'-tetramethyl-1',3', 2'-dioxaborolan-2'-yl)-9,9-didecylfluorene, 0.187 g (0.409 mmol) of 4,7-di-2'-(5'-bromo)-thienyl-2,1,3-benzothiazole, and 0.00774 g (0.0215 mmol) of 1,6-dibromopyrene were charged into a reaction flask and maintained in a vacuum for 1 hour, after which 7 ml of toluene was added thereto and the mixture was stirred for 30 minutes, thereby obtaining 200 mg of a polymer-3 [Mw=26,400 g/mol (PDI=2.0)].

Example 3

Synthesis of Conductive Polymer-4

Polymer 4:

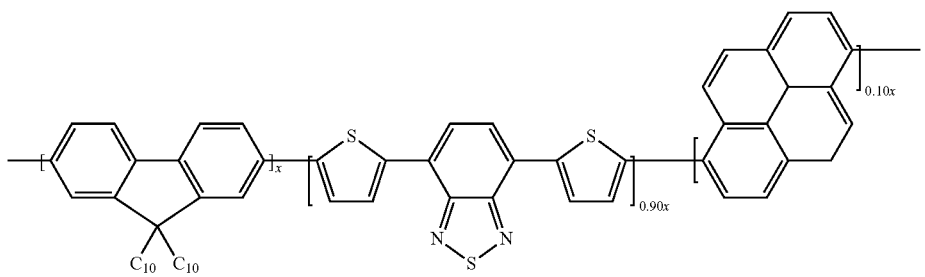

The procedure of Example 1 was repeated, except that 0.300 g (0.429 mmol) of 2,7-bis(4',4',5',5'-tetramethyl-1',3', 2'-dioxaborolan-2'-yl)-9,9-didecylfluorene, 0.177 g (0.386 mmol) of 4,7-di-2'-(5'-bromo)-thienyl-2,1,3-benzothiazole, and 0.0155 g (0.043 mmol) of 1,6-dibromopyrene were charged into a reaction flask and maintained in a vacuum for 1 hour, after which 7 ml of toluene was added thereto and the mixture was stirred for 30 minutes, thereby obtaining 200 mg of a polymer-4 [Mw=25,000 g/mol (PDI=2.3)].

Comparative Example 1

Synthesis of Conductive Polymer-1

Polymer 1:

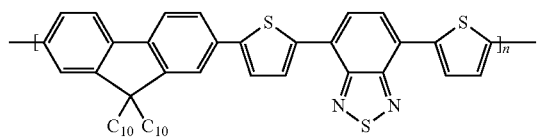

The procedure of Example 1 was repeated, except that 0.263 g (0.400 mmol) of 2,7-bis(4',4',5',5'-tetramethyl-1',3', 2'-dioxaborolan-2'-yl)-N—,9"-heptadecanylcarbazole, and 0.183 g (0.400 mmol) of 4,7-di-2'-(5'-bromo)-thienyl-2,1,3- benzothiazole were charged into a reaction flask and maintained in a vacuum for 1 hour, after which 4 ml of toluene was added thereto and the mixture was stirred for 30 minutes, thereby obtaining 300 mg of a polymer-1 [Mw=31,000 g/mol (PDI=3.9)]. Elementary analysis for $C_{47}H_{52}N_2S_3$: calculated: C, 75.96; H, 7.32; N, 3.77; S, 12.94. found: C, 75.84; H, 7.25; N, 3.71; S, 12.98.

Comparative Example 2

Synthesis of Conductive Polymer-5

Polymer 5:

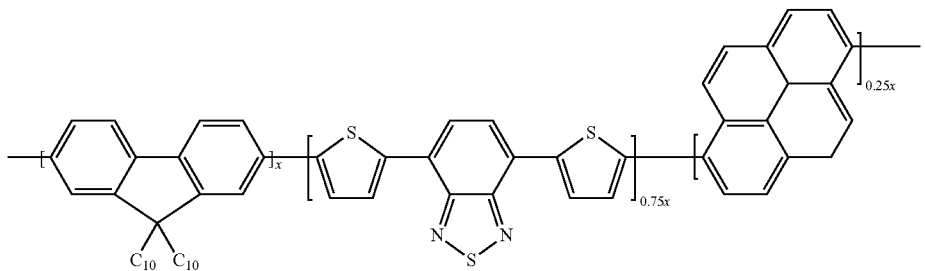

The procedure of Example 1 was repeated, except that 0.300 g (0.429 mmol) of 2,7-bis(4',4',5',5'-tetramethyl-1',3',2'-dioxaborolan-2'-yl)-9,9-didecylfluorene, 0.148 g (0.322 mmol) of 4,7-di-2'-(5'-bromo)-thienyl-2,1,3-benzothiazole, and 0.0385 g (0.107 mmol) of 1,6-dibromopyrene were charged into a reaction flask and maintained in a vacuum for 1 hour, after which 7 ml of toluene was added thereto and the mixture was stirred for 30 minutes, thereby obtaining 200 mg of a polymer-5 [Mw=27,000 g/mol (PDI=2.7)].

Comparative Example 3

Synthesis of Conductive Polymer-6

Polymer 6:

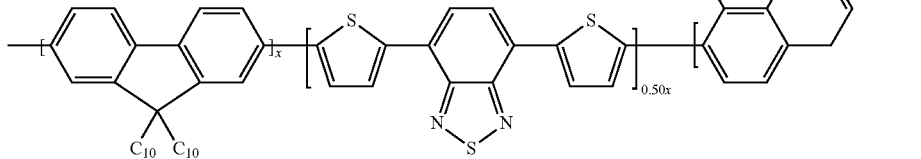

The procedure of Example 1 was repeated, except that 0.300 g (0.429 mmol) of 2,7-bis(4',4',5',5'-tetramethyl-1',3',2'-dioxaborolan-2'-yl)-9,9-didecylfluorene, 0.0985 g (0.215 mmol) of 4,7-di-2'-(5'-bromo)-thienyl-2 μl, 3' benzothiazole, and 0.0774 g (0.215 mmol) of 1,6-dibromopyrene were charged into a reaction flask and maintained in a vacuum for 1 hour, after which 7 ml of toluene was added thereto and the mixture was stirred for 30 minutes, thereby obtaining 200 mg of a polymer-6 [Mw=45,000 g/mol (PDI=2.8)].

Example 4

Fabrication of Organic Solar Cell 1

Each of the pyrene-containing conductive polymers of Examples 1 to 3 and Comparative Examples 1 to 3, synthesized by the Suzuki's method, was used as an electron donor, and a $C_{70}$-PCBM was used as an electron acceptor. The electron donor and the electron acceptor were mixed with each other at a weight ratio of 1:3 to prepare a photoelectric conversion layer material, which was then dissolved in a chlorobenzene solvent at a content of 1.5 wt %. Then, the solution was spin-coated on an ITO glass substrate having a PEDOT layer formed thereon in an argon atmosphere, thereby forming a photoelectric conversion layer having a thickness of 60-120 nm. Then, the resulting structure was heat-treated on a hot plate at 120° C. for 5 minutes. After this, in a vacuum chamber having a vacuum degree of $10^{-7}$ torr or less, 0.6 nm of LiF and 100-200 nm of aluminum were sequentially thermally deposited on the photoelectric conversion layer, thereby fabricating an organic solar cell.

Test Example 1

Electro-Optical Properties of Organic Solar Cell Comprising Organic Photovoltaic Device Each of the polymers of Examples 1 to 3 and Comparative Examples 1 to 3, prepared as shown in the following reaction scheme 1, was mixed with $C_{70}$-PCBM at a weight ratio of 1:3 to prepare a photoelectric conversion layer material, and the electro-optical properties of an organic solar cell comprising the prepared photoelectric conversion layer material were measured. The results of the measurement are shown in Table 1 below.

Figure 2:
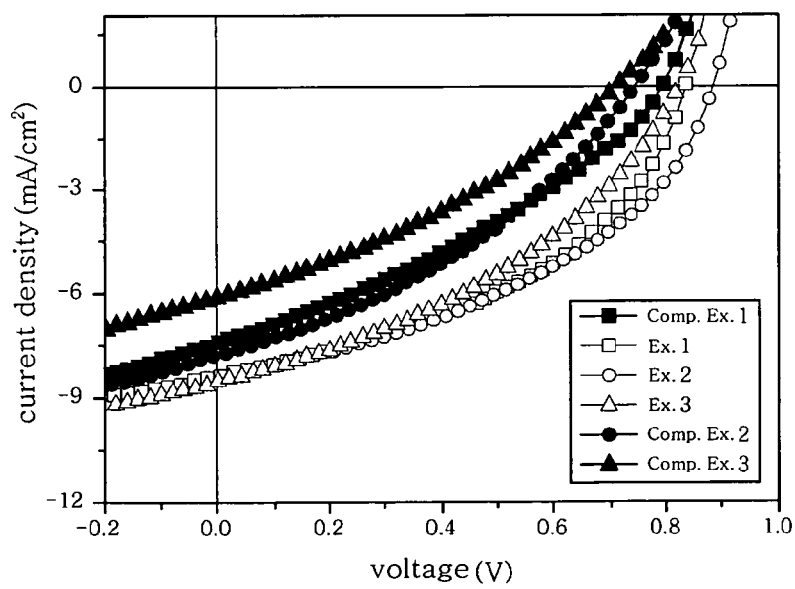
FIG. 2 shows the results of measurement of the current density-voltage (J-V) of an organic solar cell fabricated according to a first preferred embodiment of the present invention.

FIG. 2 is a graphic diagram showing the results of measuring the current density-voltage (J-V) of the organic solar cell comprising the photoelectric conversion layer material prepared by mixing each of the conductive polymers of Examples 1 to 3 and Comparative Examples 1 to 3 with $C_{70}$-PCBM at a weight ratio of 1:3.

Among the electro-optical properties, fill factor and power conversion efficiency were calculated using the following equations 1 and 2, respectively.

$$\text{Fill factor} = (V_{mp} \times I_{mp})/(V_{oc} \times I_{sc}) \quad \text{[Equation 1]}$$

wherein $V_{mp}$ is the voltage value at the maximum power point, $I_{mp}$ is current density, $V_{oc}$ is open-circuit voltage, and $I_{sc}$ is short-circuit current.

$$\text{Power conversion efficiency (\%)} = \text{fill factor} \times (J_{sc} \times V_{oc})/100 \quad \text{[Equation 2]}$$

wherein $J_{sc}$ is short-circuit current density, and $V_{oc}$ is open-circuit voltage.

[Reaction Scheme 1]

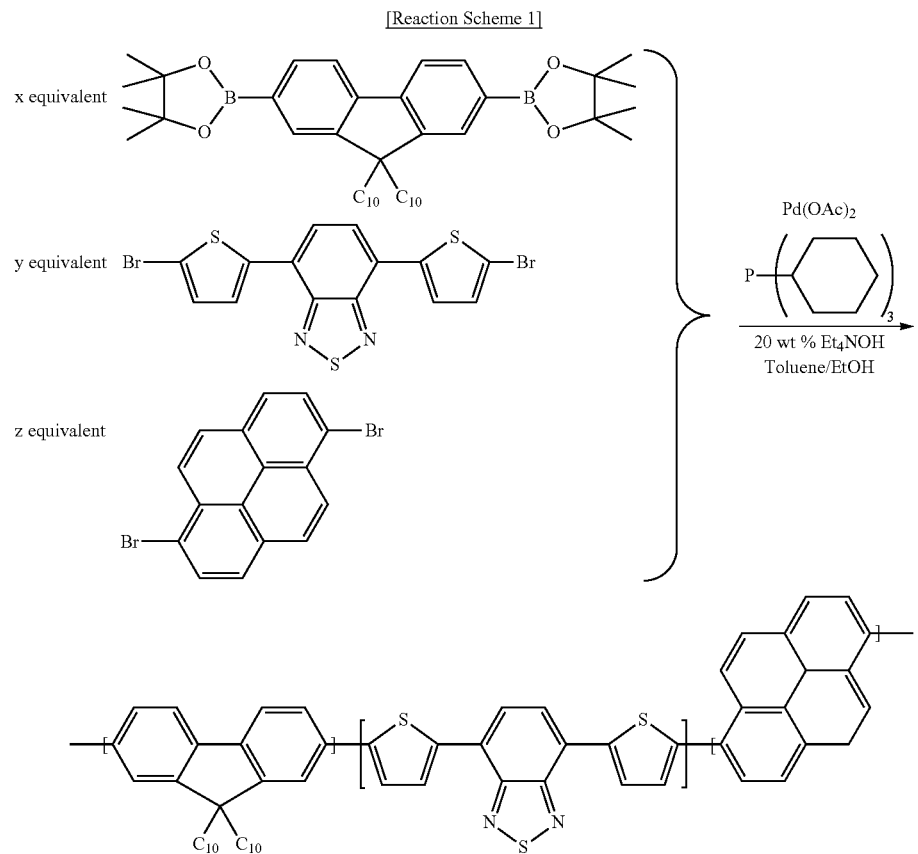

TABLE 1

Fabrication of organic photovoltaic devices and optical properties of organic solar cells comprising the same

| | Polymer | Loading ratio (x/y/z) | Addition ratio (l/m/n) | Short-circuit current density (Jsc) (mA/cm²) | Open voltage (Voc) (V) | Fill factor (FF) | Power conversion efficiency (%) |
|---|---|---|---|---|---|---|---|
| Comp. Example 1 | Polymer-1 | 0.5/0.5/0 | 0.5/0.5/0 | 7.44 | 0.80 | 0.33 | 1.99 |
| Example 1 | Polymer-2 | 0.50/0.485/0.015 | 0.50/0.485/0.015 | 8.42 | 0.84 | 0.44 | 3.09 |
| Example 2 | Polymer-3 | 0.50/0.475/0.025 | 0.50/0.450/0.050 | 8.51 | 0.89 | 0.42 | 3.16 |
| Example 3 | Polymer-4 | 0.50/0.450/0.050 | 0.50/0.455/0.045 | 8.56 | 0.83 | 0.39 | 2.75 |
| Comp. Example 2 | Polymer-5 | 0.50/0.375/0.125 | 0.50/0.410/0.090 | 7.84 | 0.75 | 0.36 | 2.11 |
| Comp. Example 3 | Polymer-6 | 0.50/0.25/0.25 | 0.50/0.30/0.20 | 6.12 | 0.72 | 0.33 | 1.46 |

As can be seen from the results in Table 1 and FIG. 2, the organic solar cells comprising the polymers of Examples 1 to 3 (polymer-2 to polymer-4), each containing a small amount of pyrene in a copolymer of fluorene and dithienylbenzothiadizole, showed increases in power conversion efficiency of 55%, 59% and 38%, respectively, compared to the polymer of Comparative Example 1 (polymer-1) containing no pyrene.

Also, the polymer of Comparative Example 2 prepared by adding more than 12.5 wt % of the monomer to fluorene showed power conversion efficiency similar to that of the polymer of Comparative Example 1 (polymer-1) containing no pyrene. In addition, in the case of the polymer of Comparative Example 3 prepared by adding more than 12.5 wt % of the monomer to fluorene, the power conversion efficiency decreased by about 27%, rather than increased, compared to that of the polymer of Comparative Example 1.

Example 5

Synthesis of Conductive Polymer-8

0.325 g (0.436 mmol) of 4,4'-bis(2-ethyl-hexyl)-5,5'-bis(trimethylsilyl)-dithieno[3,2-b:2',3'-d]silole, 0.122 g (0.414 mmol) of 4,7-bromo-2,1,3-benzothiadiazole, 0.00784 g (0.0218 mmol) of 1,6-dibromopyrene and 2 ml of toluene were charged into a reaction flask and bubbled with nitrogen for 10 minutes to remove oxygen dissolved in the solvent. 11.8 mg (0.0129 mmol) of $Pd_2(dba)_3$ and 11.7 mg (0.0386 mmol) of $P(o\text{-tolyl})_3$ were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120° C. 0.05 g of tributylphenyl tin was added thereto and allowed to react for 3 hours, and then 0.12 g of bromobenzene was added and reacted for 4 hours. The reaction solution was dropped into 300 ml of methanol, and the resulting crude solid polymer was washed with methanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 130 mg of a polymer-8 [Mw=67,000 g/mol (PDI-1.8)].

Example 6

Synthesis of Conductive Polymer-9

0.325 g (0.436 mmol) of 4,4'-bis(2-ethyl-hexyl)-5,5'-bis(trimethylsilyl)dithienosilole, 0.180 g (0.392 mmol) of 4,7-bromo-2,1,3-benzothiadiazole, 0.0157 g (0.0436 mmol) of 1,6-dibromopyrene and 2 ml of toluene were charged into a reaction flask and bubbled with nitrogen for 10 minutes to remove oxygen dissolved in the solvent.

11.8 mg (0.0129 mmol) of $Pd_2(dba)_3$ and 11.7 mg (0.0386 mmol) of $P(o\text{-tolyl})_3$ were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120° C. The subsequent procedures were carried out in the same manner as Example 5, thereby obtaining 180 mg of a polymer-9 [Mw=60,000 g/mol (PDI=1.7)].

Comparative Example 4

Synthesis of Conductive Polymer-7

0.325 g (0.436 mmol) of 4,4'-bis(2-ethyl-hexyl)-5,5'-bis(trimethylsilyl)dithienosilole, 0.200 g (0.436 mmol) of 4,7-bromo-2,1,3-benzothiadiazole and 2 ml of toluene were charged into a reaction flask and bubbled with nitrogen for 10 minutes to remove oxygen dissolved in the solvent.

11.8mg (0.0129 mmol) of $Pd_2(dba)_3$ and 11.7 mg (0.0386 mmol) of $P(o\text{-tolyl})_3$ were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120° C. The subsequent procedures were carried out in the same manner as Example 5, thereby obtaining 180 mg of a polymer-7 [Mw=40,000 g/mol (PDI=1.3)].

Example 7

Fabrication of Organic Photovoltaic Device 2

Each of the pyrene-containing conductive polymers of Examples 5 and 6 and Comparative Example 4, synthesized by the Stille's method, was used as an electron donor, and $C_{70}$-PCBM was used as an electron acceptor. The electron donor and the electron acceptor were mixed with each other at a weight ratio of 1:3 to prepare a photoelectric conversion layer material, which was then dissolved in a chlorobenzene solvent at a content of 1.5 wt %. Then, using the solution, an organic photovoltaic device was manufactured in the same manner as Example 4.

Test Example 2

Electro-Optical Properties of Organic Photovoltaic Device

Each of the polymers of Examples 5 and 6 and Comparative Example 4, prepared as shown in the following reaction scheme 2, was mixed with $C_{70}$-PCBM at a weight ratio of 1:3 to prepare a photoelectric conversion layer material, and the electro-optical properties of an organic solar cell comprising the prepared photoelectric conversion layer material were measured. The results of the measurement are shown in Table 2 below.

Figure 3:
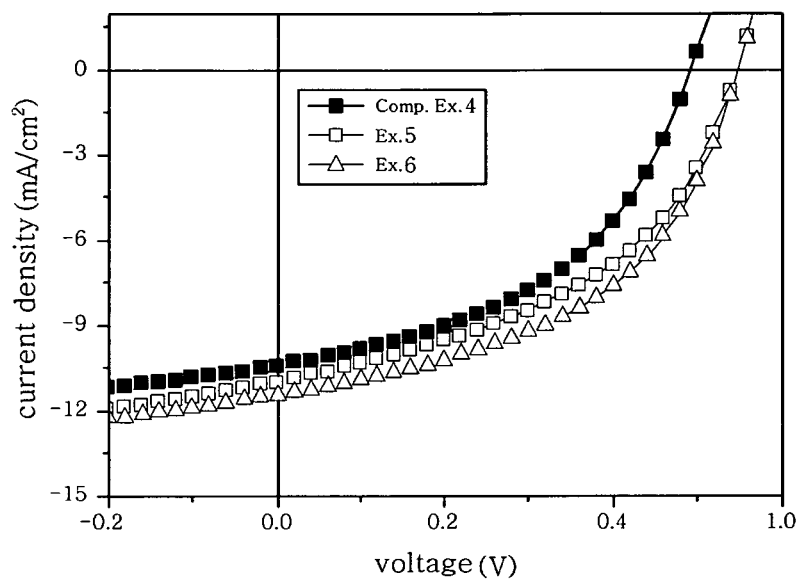
FIG. 3 shows the results of measurement of the current density-voltage (J-V) of an organic solar cell fabricated according to a second preferred embodiment of the present invention.

FIG. 3 is a graphic diagram showing the results of measuring the current density-voltage (J-V) of the organic solar cell device comprising the photoelectric conversion layer material prepared by mixing each of the conductive polymers of Examples 5 and 6 and Comparative Example 4 with $C_{70}$-PCBM at a weight ratio of 1:3.

[Reaction Scheme 2]

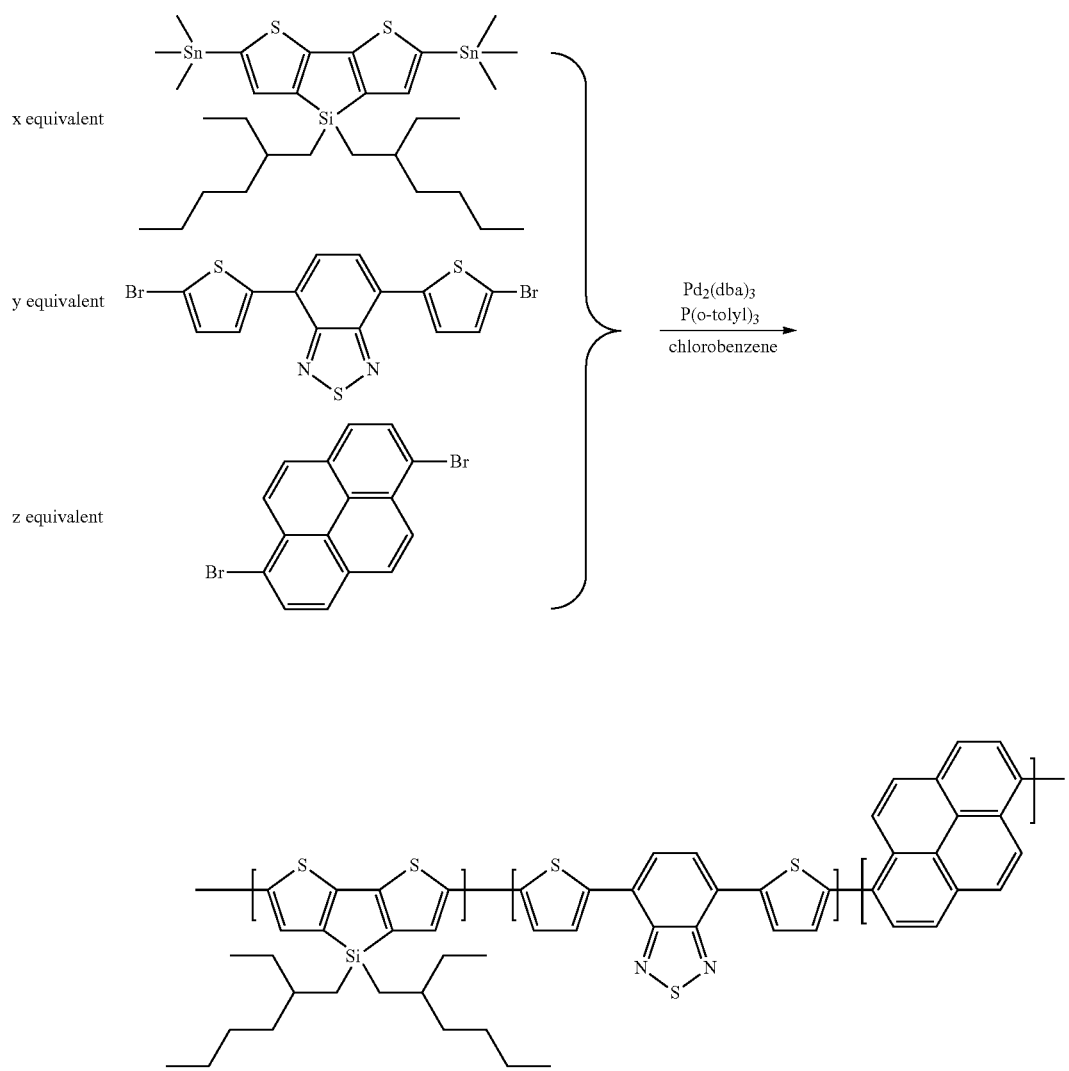

TABLE 2

Fabrication of organic photovoltaic devices and electro-optical properties of organic solar cells comprising the same

| | Polymer | Loading ratio (x/y/z) | Addition ratio (l/m/n) | Short-circuit current density (Jsc) (mA/cm$^2$) | Open voltage (Voc) (V) | Fill factor (FF) | Power conversion efficiency (%) |
| --- | --- | --- | --- | --- | --- | --- | --- |
| Comp. Example 4 | Polymer-7 | 0.5/0.5/0 | 0.5/0.5/0 | 10.30 | 0.49 | 0.47 | 2.39 |
| Example 5 | Polymer-8 | 0.5/0.475/0.025 | 0.5/0.495/0.005 | 10.98 | 0.55 | 0.46 | 2.76 |
| Example 6 | Polymer-9 | 0.50/0.45/0.05 | 0.5/0.455/0.45 | 11.44 | 0.55 | 0.49 | 3.06 |

As can be seen from the results in Table 2 above and FIG. 3, the polymers of Examples 5 and 6 (polymer-8 and polymer-9), each containing a small amount of pyrene in a copolymer of dithiophenesilole and benzothiadiazole, showed increases in power conversion efficiency of 15% and 28%, respectively, compared to the polymer of Comparative Example 4 (polymer-7) containing no pyrene.

Example 8

Synthesis of Conductive Polymer-11

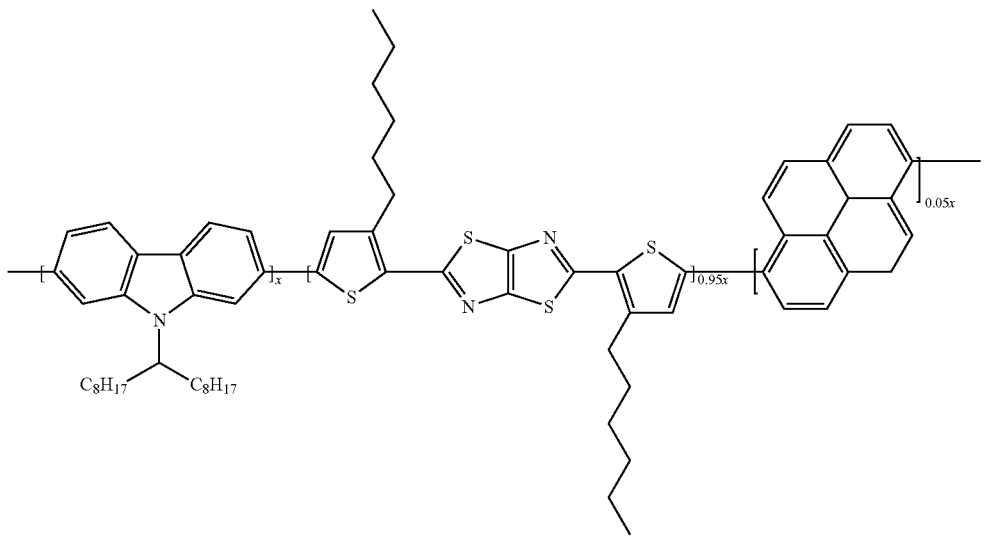

Step 1: Preparation of 2,5-bis(5-bromo-3-hexylthiophen-2-yl)-thiazolo[5,4-d]thiazole 0.720 g (1.52 mmol) of 2,5-bis(3-hexylthiphen-2-yl)-thiazolo[5,4-d]thiazole and 0.541 g (3.04 mmol) of N-bromosuccinimide (NBS) were charged into a reaction flask and dissolved in 35 ml of chloroform, followed by reaction under reflux for 3 hours. The reaction temperature was lowered to room temperature, after which the reaction product was washed about twice with water and dried with $MgSO_4$ to remove water, followed by removal of the solvent.

Then, the residue was purified by column chromatography using hexane/chloroform (50:1) as a developing solvent, thereby obtaining 0.3 g (31% yield) of the target compound, 2,5-bis(5-bromo-3-hexylthiophen-2-yl)-thiazolo[5,4-d]thiazole.

$^1$H NMR (300 MHz, $C_6D_6$) (ppm): 6.96 (s, 2H), 2.91 (t, 4H), 1.67 (q, 4H), 1.34 (br, 12H), 0.91 (t, 6H).

Step 2: Preparation of 2,7-bis(4',4',5',5'-tetramethyl-1',3',2'-dioxaborolan-2'-yl)-N-9"'-heptadecanylcarbazole In a reaction flask, 5.000 g (8.87 mmol) of N-9'-heptadecanyl-2,7-dibromocarbazole was dissolved in 100 ml of THF and maintained at −78° C., and then 7.27 ml (18.18 mmol) of n-BuLi (2.5 M hexane solution) was added dropwise thereto. Then, the solution was stirred at the same temperature for 1 hour, after which 3.63 ml (19.51 mmol) of 2-isopropoxy-4,4,5,5-tetramethyl-1,3,2-dioxaborane was added dropwise thereto. The solution was further stirred at the same temperature for 1 hour, after which the temperature of the reactor was elevated to room temperature, and then the solution was stirred for 16 hours. The reaction product was poured in water, extracted with diethyl ether and dried with $MgSO_4$ to remove a trace amount of water, followed by removal of the solvent.

The residue was recrystallized from methanol/acetone (10:1) and purified, thereby obtaining 2.5 g (50% yield) of the target compound, 2,7-bis(4',4',5',5'-tetramethyl-1',3',2'-dioxaborolan-2'-yl)-N-9"'-heptadecanylcarbazole.

$^1$H NMR (300 MHz, $C_6D_6$) (ppm): 8.44 (br, 1H), 8.19 (d, J=7.8 Hz, 1H), 8.15 (t, J=8.1 Hz, 2H), 8.10 (d, J=7.7 Hz, 1H), 4.50 (m, 1H), 2.33 (m, 2H), 1.61 (m, 2H), 1.22 (br, 4H), 1.19 (br, 12H), 1.17 (br, 12H), 1.03 (br, 20H), 0.87 (t, J=7.1 Hz, 6H).

Step 3: Preparation of Conductive Polymer 0.240 g (0.380 mmol) of 2,5-bis(5-bromo-3-hexylthiophen-2-yl)-thiazolo[5,4-d]thiazole prepared in step 1, 0.0072 g (0.020 mmol) of 1,6-dibromopyrene, and 0.263 g (0.400 mmol) of 2,7-bis(4',4',5',5'-tetramethyl-1',3',2'-dioxaborolan-2'-yl)-N-9"'-heptadecanylcarbazole prepared in step 2 were charged into a reaction flask and maintained in a vacuum for 1 hour, after which 4 ml of toluene was added thereto, and the mixture was stirred for 30 minutes. After 1.296 g of 20 wt % $Et_4NOH$ has been added thereto, the solution was bubbled with nitrogen to remove oxygen dissolved in the solvent.

Then, 5.4 mg (0.008 mmol) of $Pd(OAc)_2$ and 3.4 mg (0.0386 mmol) of tricyclohexylphosphine were added thereto, and the mixture was refluxed in a nitrogen atmosphere for 24 hours while the temperature of the external oil bath was maintained at 90° C. The reaction solution was dropped into 300 ml of methanol, and the resulting crude solid polymer was washed with each of methanol and ethanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 210 mg of a conductive polymer [Mw=57,000 g/mol (PDI=2.2)].

Comparative Example 5

Synthesis of Conductive Polymer-10

0.253 g (0.400 mmol) of 2,5-bis(5-bromo-3-hexylthiophen-2-yl)-thiazolo[5,4-d]thiazole prepared in step 1, and 0.263 g (0.400 mmol) of 2,7-bis(4',4',5',5'-tetramethyl-1',3',2'-dioxaborolan-2'-yl)-N-9''-heptadecanylcarbazole prepared in step 2 were charged into a reaction flask and maintained in a vacuum for 1 hour, after which 4 ml of toluene was added thereto, and the mixture was stirred for 30 minutes. After 1.296 g of 20 wt % Et$_4$NOH has been added thereto, the solution was bubbled with nitrogen to remove oxygen dissolved in the solvent.

Then, 5.4 mg (0.008 mmol) of Pd(OAc)$_2$ and 3.4 mg (0.0386 mmol) of tricyclohexylphosphine were added thereto, and the mixture was refluxed in a nitrogen atmosphere for 24 hours while the temperature of the external oil bath was maintained at 90° C. The reaction solution was dropped into 300 ml of methanol, and the resulting crude solid polymer was washed with each of methanol and ethanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 320 mg of a conductive polymer [Mw=58,000 g/mol (PDI=2.9)].

Elementary analysis for $C_{53}H_{69}N_3S_4$: calculated: C, 72.63; H, 7.94; N, 4.79; S, 14.63. found: C, 72.46; H, 7.82; N, 4.58; S, 14.20.

Example 9

Fabrication of Organic Photovoltaic Device 3

Each of the polymers of Example 8 and Comparative Example 5, synthesized by the Suzuki's method, was used as an electron donor, and C$_{70}$-PCBM was used as an electron acceptor. The electron donor and the electron acceptor were mixed with each other at a weight ratio of 1:3 to prepare a photoelectric conversion layer material, which was then dissolved in a chlorobenzene solvent at a content of 1.5 wt %. Then, the solution was spin-coated on an ITO glass substrate having a PEDOT layer formed thereon in an argon atmosphere, thereby forming a photoelectric conversion layer having a thickness of 70-120 nm. Then, the resulting structure was heat-treated on a hot plate at 120° C. for 5 minutes.

Next, in a vacuum chamber having a vacuum degree of $10^{-7}$ torr or less, 0.6 nm of LiF and 100-200 nm of aluminum were sequentially thermally deposited on the photoelectric conversion layer, thereby fabricating an organic photovoltaic device.

Test Example 3

Electro-Optical Properties of Organic Solar Cell Comprising Organic Photovoltaic Device Each of the polymers prepared in Example 8 and Comparative Example 5 was mixed with C$_{70}$-PCBM at a weight ratio of 1:3 to prepare a photoelectric conversion layer material, and the electro-optical properties of an organic solar cell comprising the prepared photoelectric conversion layer material were measured. The results of the measurement are shown in Table 3 below.

Figure 4:
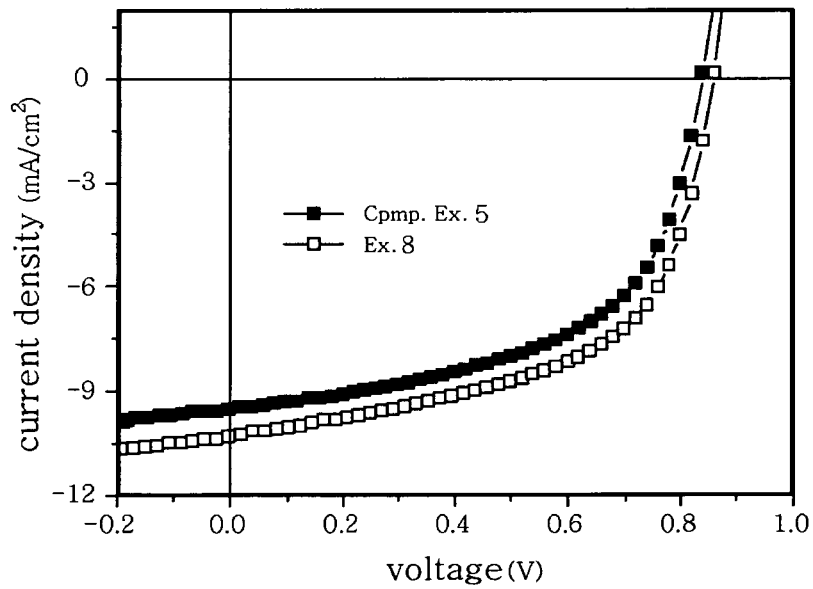
FIG. 4 shows the results of measurement of the current density-voltage (J-V) of an organic solar cell fabricated according to a third preferred embodiment of the present invention.

FIG. 4 is a graphic diagram showing the results of measuring the current density-voltage (J-V) of the organic solar cell comprising the photoelectric conversion layer material prepared by mixing each of the conductive polymers of Example 8 and Comparative Example 5 with C$_{70}$-PCBM at a weight ratio of 1:3.

TABLE 3

Fabrication of organic photovoltaic devices and electro-optical properties of organic solar cells comprising the same

| | Polymer | Loading ratio (x/y/z) | Addition ratio (l/m/n) | Short-circuit current density (Jsc) (mA/cm$^2$) | Open voltage (Voc) (V) | Fill factor (FF) | Power conversion efficiency (%) |
|---|---|---|---|---|---|---|---|
| Comp. Example 5 | Polymer-10 | 0.5/0.5/0 | 0.5/0.5/0 | 0.84 | 9.53 | 0.56 | 4.50 |
| Example 8 | Polymer-11 | 0.50/0.485/0.015 | 0.50/0.485/0.015 | 0.86 | 10.33 | 0.57 | 5.10 |

As can be seen in Table 3, the conductive polymer of Example 8 of the present invention comprises both donor and acceptor segments, and particularly contains dithiophene and thiazolothiazole groups, and the organic solar cell comprising the conductive polymer of the present invention has both high photon absorption efficiency and improved hole mobility. Thus, the conductive polymer of the present invention is useful as a polymer for organic solar cells.

FIG. 4 shows the results of measuring the current density-voltage of the organic solar cells, each comprising the conductive copolymer of Example 8 (polymer 11) containing a small amount of pyrene, and the conductive polymer of Comparative Example 5 (polymer 10). As can be seen from the results in FIG. 4, the polymer of Example 8 of the present invention showed improvements in short-circuit current and fill factor compared to the polymer of Comparative Example 5 containing no pyrene, and the organic solar cell comprising the conductive polymer of Example 8 had high power conversion efficiency. Particularly, because the inventive conductive polymer for organic solar cells is prepared as a solution, it can provide large-area devices in a cost-effective manner.

INDUSTRIAL APPLICABILITY

As described above, the present invention provides the conductive polymer comprising a specific amount of pyrene introduced either into a polymer, which consists only of a donor functional group containing one or more aromatic monomers, or into a donor-acceptor type polymer comprising a repeating acceptor group introduced into a donor functional group. The conductive polymer has increased charge transfer rate, and thus when it is used as an electron donor in an organic solar cell, it can improve the power conversion efficiency of the organic solar cell.

Furthermore, the conductive polymer of the present invention shows high photon absorption efficiency and hole mobility, and thus can be used as an organic photovoltaic material which can be used in various fields, including organic photodiodes, organic light-emitting diodes, organic thin-film transistors, and organic solar cells.

In addition, the present invention provides the organic photovoltaic device comprising the pyrene-containing conductive polymer as an electron donor, and thus can achieve high photoelectric conversion efficiency in the organic thin film solar cell.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A pyrene-containing conductive polymer represented by the following formula 1:

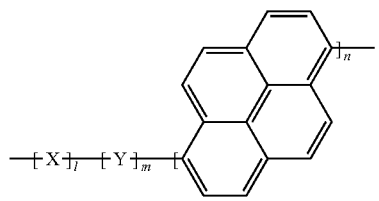

[Formula 1]

wherein l is a molar fraction of monomer X and is $$0.40 \leq \frac{l}{l+m+n} < 1,$$

m is a molar fraction of monomer Y and is $$0.41 < \frac{m}{l+m+n} \leq 0.50,$$

n is a molar fraction of pyrene and is $$0 < \frac{n}{l+m+n} \leq 0.10,$$

X is a donor monomer and Y is an acceptor monomer.

2. The pyrene-containing conductive polymer according to claim 1, wherein n is $$\frac{n}{l+m+n}$$

$$0 < \frac{n}{l+m+n} \leq 0.05.$$

3. The pyrene-containing conductive polymer according to claim 1, wherein the donor monomer is one selected from the group of compounds represented by the following formulas 2 to 10 consisting of:

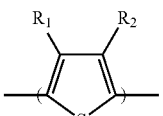
[Formula 2]

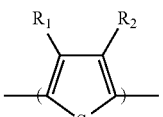
[Formula 3]

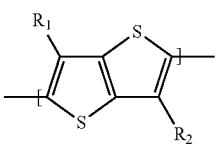
[Formula 4]

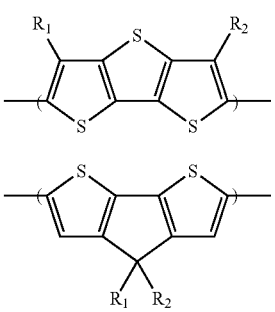
[Formula 5]

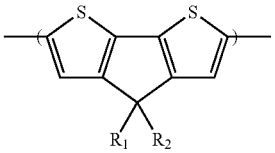
[Formula 6]

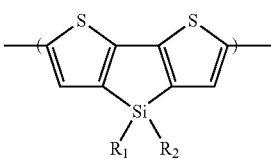
[Formula 7]

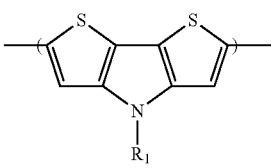
[Formula 8]

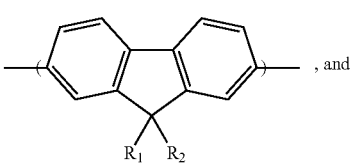
[Formula 9]

, and

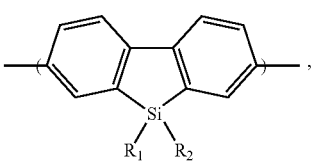
[Formula 10]

, wherein $R_1$ or $R_2$ is a $C_1$-$C_{20}$ straight or branched alkyl group, a $C_1$-$C_{20}$ heterocycloalkyl, a $C_6$-$C_{20}$ aryl or a $C_6$-$C_{20}$ heteroaryl.

4. The pyrene-containing conductive polymer according to claim 1, wherein the acceptor monomer is one selected from compounds represented by the following formulas 11 to 17 consisting of:

[Formula 11]

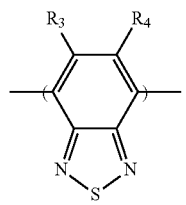

[Formula 12]

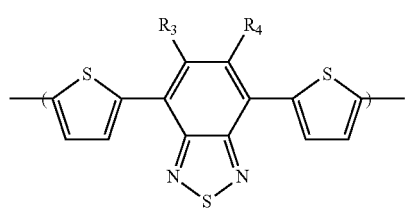

[Formula 13]

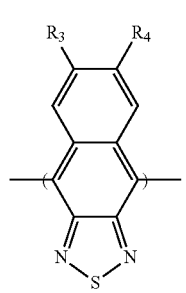

[Formula 14]

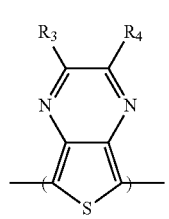

[Formula 15]

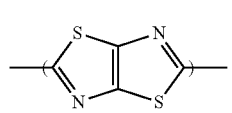

[Formula 16]

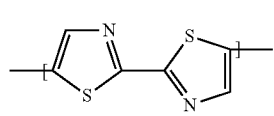

[Formula 17]

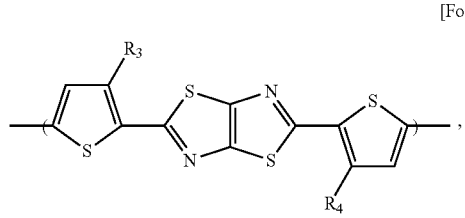

wherein $R_3$ or $R_4$ is a $C_1$-$C_{20}$ straight or branched alkyl group, a $C_1$-$C_{20}$ alkoxy group, a $C_1$-$C_{20}$ heterocycloalkyl, a $C_6$-$C_{20}$ aryl or a $C_6$-$C_{20}$ heteroaryl, and $R_3$ and $R_4$ may be the same or different.

5. A material for organic photovoltaic materials, comprising a pyrene-containing conductive polymer represented by the following formula 1 and is used in any one selected from the group consisting of organic photodiodes, organic light-emitting diodes, organic thin-film transistors and organic solar cells:

[Formula 1]

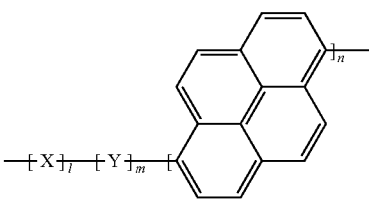

wherein l is a molar fraction of monomer X and is $$0.40 \le \frac{l}{l+m+n} < 1,$$

m is a molar fraction of monomer Y and is $$0.41 < \frac{m}{l+m+n} \le 0.50,$$

n is a molar fraction of pyrene and is $$0 < \frac{n}{l+m+n} \le 0.10,$$

X is a donor monomer and Y is an acceptor monomer.

6. The material according to claim 5, wherein n is $$0 < \frac{n}{l+m+n} \le 0.05.$$

7. An organic solar cell comprising a substrate, a first electrode, a buffer layer, a photoelectric conversion layer and a second electrode, wherein the photoelectric conversion layer is made of a solution containing a photoelectric conversion material which is a mixture of the pyrene-containing conductive polymer of formula 1 as an electron donor and a $C_{60}$ or $C_{70}$ fullerene derivative as an electron acceptor:

[Formula 1]

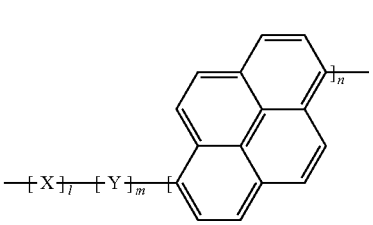

wherein l is a molar fraction of monomer X and is $$0.40 \leq \frac{l}{l+m+n} < 1,$$

m is a molar fraction of monomer Y and is $$0.41 < \frac{m}{l+m+n} \leq 0.50,$$

n is a molar fraction of pyrene and is $$0 < \frac{n}{l+m+n} \leq 0.10,$$

X is a donor monomer and Y is an acceptor monomer.

8. The organic solar cell according to claim 7, wherein n is $$0 < \frac{n}{l+m+n} \leq 0.05.$$

9. The organic solar cell according to claim 7, wherein the photoelectric conversion layer is made of the photoelectric conversion material which is the mixture of the pyrene-containing conductive polymer of formula 1 as the electron donor and the $C_{60}$ or $C_{70}$ fullerene derivative as the electron acceptor, wherein the electron donor and the electron acceptor are mixed with each other at a weight ratio of 1:0.5-1:4.

10. The organic solar cell according to claim 7, wherein the solution containing the photoelectric conversion material is a solution prepared by dissolving the photoelectric conversion material in any one solvent selected from the group consisting of chlorobenzene, 1,2-dichlorobenzene and chloroform at a concentration of 1.0-3.0 wt %.

11. The organic solar cell according to claim 7, wherein the solution containing the photoelectric conversion material is applied or coated by a method selected from the group consisting of inkjet printing, spin coating, screen printing and doctor blade coating.

* * * * *